(12) United States Patent
Mirone et al.

(10) Patent No.: US 7,341,791 B2
(45) Date of Patent: Mar. 11, 2008

(54) PHOTO-CROSSLINKABLE MULTI-COATING SYSTEM HAVING IMPROVED GAS BARRIER PROPERTIES

(75) Inventors: Gianni Mirone, Alessandria (IT); Roberta Pesce, Acqui Terme (IT)

(73) Assignee: Plastlac S.r.l., Alessandria (IT)

( * ) Notice: Subject to any disclaimer, the term of this patent is extended or adjusted under 35 U.S.C. 154(b) by 289 days.

(21) Appl. No.: 10/513,005

(22) PCT Filed: Apr. 22, 2003

(86) PCT No.: PCT/EP03/04118

§ 371 (c)(1), (2), (4) Date: Oct. 26, 2004

(87) PCT Pub. No.: WO03/093329

PCT Pub. Date: Nov. 13, 2003

(65) Prior Publication Data

US 2005/0171229 A1 Aug. 4, 2005

(30) Foreign Application Priority Data

Apr. 30, 2002 (IT) .......................... TO2002A0362

(51) Int. Cl.
- B32B 27/00 (2006.01)
- B32B 27/30 (2006.01)
- B32B 27/32 (2006.01)
- B32B 27/34 (2006.01)
- B32B 27/36 (2006.01)
- B32B 27/40 (2006.01)
- C09D 129/04 (2006.01)

(52) U.S. Cl. .................. 428/476.3; 428/483; 428/515; 428/516; 428/517; 522/154; 522/170; 522/182; 522/173

(58) Field of Classification Search .................. 522/84, 522/85, 86, 154, 170, 173, 182; 428/476.3, 428/483, 515, 516, 517

See application file for complete search history.

(56) References Cited

U.S. PATENT DOCUMENTS

| | | | |
|---|---|---|---|
| 3,294,577 A | 12/1966 | Mayer | |
| 3,941,730 A | 3/1976 | Solenberger | |
| 4,631,245 A | 12/1986 | Pawlowski | |
| 4,753,845 A * | 6/1988 | Sumi et al. | 428/327 |
| 5,061,603 A * | 10/1991 | Hamilton et al. | 430/287.1 |
| 5,206,113 A * | 4/1993 | Mueller-Hess et al. | 430/270.1 |
| 5,401,603 A * | 3/1995 | Bodager et al. | 430/158 |
| 5,661,199 A | 8/1997 | Bederke et al. | |
| 5,770,301 A * | 6/1998 | Murai et al. | 428/213 |
| 6,136,507 A * | 10/2000 | Morigaki | 430/283.1 |
| 6,395,459 B1 * | 5/2002 | Taylor et al. | 430/434 |
| 6,869,675 B2 * | 3/2005 | Nair et al. | 428/327 |
| 2006/0293448 A1 * | 12/2006 | Nishiura et al. | 525/57 |

FOREIGN PATENT DOCUMENTS

| | | |
|---|---|---|
| DE | 198 11 333 | 9/1999 |
| EP | 0 373 537 | 6/1990 |
| GB | 2 263 699 | 8/1993 |
| JP | 62-141003 | 6/1987 |
| WO | 93/03068 | 2/1993 |
| WO | 96/37551 | 11/1996 |
| WO | 01/32720 | 5/2001 |
| WO | 01/90202 | 11/2001 |

* cited by examiner

Primary Examiner—Susan Berman
(74) Attorney, Agent, or Firm—Merchant & Gould P.C.

(57) ABSTRACT

The present invention relates to a multi-coating system with gas-barrier properties which is able to undergo photo-crosslinking by means of UV radiation and is particularly suitable for the external protection of containers made of thermoplastic polymers, such as bottles made of PET. The system comprises a solution that is able to undergo photo-crosslinking by means of exposure to UV radiation and a composition that is able to undergo photo-crosslinking by means of exposure to UV radiation, where said photo-crosslinkable solution comprises a substance photo-sensitive to UV radiation, and said photo-crosslinkable composition comprises mixtures of crosslinkable resins and photo-initiators.

30 Claims, No Drawings

PHOTO-CROSSLINKABLE MULTI-COATING SYSTEM HAVING IMPROVED GAS BARRIER PROPERTIES

DESCRIPTION

The present invention relates to a multi-coating system with gas-barrier properties, which is particularly suitable for the external protection of containers made of thermoplastic material, such as PE, PP, PET, PVC, PA, etc.

In particular, the present invention regards a multi-coating system provided with barrier effect in regard to oxygen, carbon dioxide and to gases in general, which is suitable for the surface treatment of disposable bottles made of polyethylene terephthalate (PET).

Disposable containers for packaging foodstuffs and bottling beverages currently present on the market must combine characteristics of infrangibility and transparency with characteristics of protection from the oxidizing attack of air.

In recent years it has been found that an increasingly large number of consumers orient their purchasing towards foodstuffs packaged in disposable plastic containers.

The above containers, which present a low ratio between surface and volume of the foodstuff product contained therein, have unsatisfactory characteristics of barrier properties in regard to gases.

As a result, foodstuffs packaged in disposable containers are more readily subject to attack by atmospheric oxygen and consequently present short preservation times.

In order to limit the above drawbacks, the use of bio-oriented PET has been introduced in the foodstuff-packaging industry, since this polymer presents high intrinsic gas-barrier characteristics, non-toxicity and inertia in regard to almost all foodstuffs.

It has, however, been found that, notwithstanding the above characteristics, PET has not proved suitable for the packaging of certain foodstuffs, such as sauces and some beverages like beer and wine because they are subject to modifications of a biochemical nature caused by oxidizing phenomena.

In order to limit the occurrence of the above drawbacks, appropriate protective-paint products are applied, which manage to limit the diffusion of oxygen inside the container made of PET.

Furthermore, there are known systems for coating containers made of PET, which adopt technologies of multilayer poly-coupled materials and plasma coating.

The painting systems used for coating that are currently commercially available present, however, certain technological limits, such as the need to resort to large quantities of solvents and to cumbersome painting lines, which render them far from competitive from the economic standpoint.

Furthermore, it has been found that the painting systems currently used for the external coating of PET entail the use of bicomponent products with a low pot-life and low polymerization rates.

One of the general purposes of the present invention consequently consists in preventing or limiting considerably the appearance of the drawbacks presented by the known art.

Another purpose of the invention consists in providing a multi-coating system provided with gas-barrier properties that will be non-toxic for the working environment.

A further purpose of the present invention consists in providing a multi-coating system provided with gas-barrier properties that will be suitable for the external protection of containers made of PET for the packaging of foodstuffs and bottling of beverages.

In the light of the above purposes and of yet others that will appear more clearly from what follows, there is provided, in accordance with a first aspect of the present invention, a multi-coating system with gas-barrier properties according to the attached claims.

In accordance with one aspect of the invention, a multi-coating system with gas-barrier properties, which can be crosslinked by means of UV radiation, is provided, comprising:
(I) a solution that is able to undergo photo-crosslinking by means of exposure to UV radiation;
(II) a composition that is able to undergo photo-crosslinking by means of exposure to UV radiation.

In accordance with one embodiment of the invention, said photo-crosslinkable solution (I) is a hydro-alcoholic solution comprising polyvinyl alcohol, a substance photo-sensitive to UV radiation, an acidifying component, and a finishing agent.

The polyvinyl alcohol (PVOH) of the photo-crosslinkable solution may be with different degrees of hydrolysis, for example a partially hydrolysed degree, with a degree of hydrolysis-saponification, expressed in mol %, advantageously of between 81 and 92, or else a completely hydrolysed degree, advantageously with a degree of hydrolysis-saponification, expressed in mol %, of between 97 and 99.

Within the framework of the invention, the use is preferred of a polyvinyl alcohol at a completely hydrolysed degree, advantageously having the following characteristics:
a degree of hydrolysis (saponification) expressed in mol % of 98.4±0.4,
an ester value (according to the standard DIN 53401), expressed as mg KOH/g, of 20±5;
a molar weight (MW) of between 60 000 and 63 000 g/mol.

An alcohol of the above type is, for example, the product MOWIOL® 10-98, produced by CLARIANT.

Polyvinyl alcohol is preferably added in a percentage amount of between 2% and 15% in de-ionized water, preferably a solution containing from 3% to 5% being the one that bestows optimal viscosity for the uses according to the invention. As photo-sensitive substance in the photo-crosslinkable solution (I), although any substance may be used which undergoes crosslinking upon exposure to ultra-violet light, it is advantageous that the above substance should comprise in its molecule at least one aldehyde functional group and at least one carbon-carbon double bond (C═C). The use is preferred of 4-[2-(4-formylphenyl) ethenyl]-1-methylpyridinium methylsulphate (empirical formula $C_{16}H_{17}NO_5S$, CAS NUMBER 74401-04-0), such as, for example, SBQ, produced by Materiali Sensibili s.r.l., having the following characteristics:
physical state: yellow powder; and
spectral sensitivity of between 250 and 400 nm.

Advantageously, the above substance that can undergo photo-crosslinking is added in a percentage of between 0.5% and 20% on the dry quantity of polyvinyl alcohol, and preferably in a percentage of between 10% and 16%, since this represents a good compromise between barrier features and price.

The acidifying component of the crosslinking solution may consist of an acid, preferably of an inorganic type, more preferably consisting of phosphoric acid, for example 80% phosphoric acid.

This acidifying component is introduced into the crosslinking solution in percentages of between 0.6% and 0.8%.

The finishing agent of said hydro-alcoholic crosslinking solution is a substance suitable for improving the features of wettability of the substrate, and advantageously comprises n-methylpyrrolidone, isopropyl alcohol, and mixtures thereof, advantageously incorporated in the solution in an amount of between 0.5 wt % and 1.5 wt %.

In order to enhance slightly the features of adhesion to the substrate and resistance to humidity of said photo-crosslinkable solution (I), there is the possible optional combination with solutions of titanium acetyl acetonate (for example, the commercially available product TYZOR® AA95, produced by DuPont).

The above product is titanium chelate, with acetyl acetone as chelating agent, and various alkoxide groups.

The above complexes of titanium acetyl acetonate react with the OH functional groups present in the molecule of polyvinyl alcohol (PVOH).

The crosslinking reaction may occur both at room temperature, within a few hours, or else at higher temperatures (e.g., at 80° C. for a few seconds).

In order to use the above complexes and to enable solubilization thereof, it is necessary first to solubilize them and stabilize them in an aqueous solution, as follows:

To 10 parts in weight of titanium acetyl acetonate add 20 parts of glacial acetic acid under gentle stirring; then add 70 parts in weight of demineralized water.

Example of solution of titanium acetyl acetonate:

| | |
|---|---|
| TYZOR ® AA95: | 10 parts |
| Glacial acetic acid: | 20 parts |
| Mix gently for 5 minutes. | |
| Demineralized water: | 70 parts |

The percentage to be used ranges from a minimum of 5% of titanium acetyl acetonate on the dry quantity of polyvinyl alcohol (PVOH) up to a maximum of 60%.

Other optional additives that may be added to the photo-crosslinkable solution (I) to enhance some features of resistance to water are the DIAZO COMPOUNDS; these salts function if activated by UV radiation with wavelengths of between 250-400 nm.

In the photo-crosslinkable solution (I), although any diazo compound that is activated upon exposure to ultraviolet light may be used, the use is preferred of benzene diazonium-4-(phenylamino)hydrogen phosphate polymer in a 1:1 solution with formaldehyde, such as for example FSO, produced by Materiali Sensibili s.r.l.

This type of sensitizing agent is stable at room temperature and in the dark; if brought up to temperatures higher than 35° C., it is triggered, and the process of linking with the OH groups of the PVOH present in the photo-crosslinkable solution (I) starts.

For this reason, it is preferable to use it immediately before application. The percentage to be used, again referred to the solid quantity of polyvinyl alcohol PVOH, is between 0.5% and 5%.

The composition (II) that can undergo photo-crosslinking by UV radiation may be of a "cationic" type (A) or else of a "radical-crosslinking acrylic" type (B).

The photo-crosslinkable composition (II) is applied with the sole purpose of protecting the photo-crosslinkable solution (I).

The choice of two different types of composition for the photo-crosslinkable solution (II) is determined by the use of the multi-layer system for different types of applications, in which different features of the coatings are called for.

It has been estimated that a photo-crosslinkable solution (II) of the UV "cationic" type presents better properties of flexibility and resistance to heat treatment.

The simulation tests are conducted by dipping the painted samples in water heated up to 85° C. for approximately 10 minutes.

This determination on the coating is performed with the purpose of simulating operating conditions for containers suitable for hot-filling (e.g., bottles made of PET for bottling HEAT-SET fruit juices).

A photo-crosslinkable solution (II) of the UV "radical-acrylic" type presents better properties of resistance to chemical treatment with acids, particularly to treatment with peracetic acid.

The simulation tests are conducted by dipping the painted samples in a 0.1% solution of peracetic acid for approximately 5 minutes.

This determination on the coating is performed with the purpose of simulating operating conditions for containers suitable for filling under asceptic conditions (e.g., bottles made of PET for bottling of fruit juices filled in an asceptic environment).

In accordance with one embodiment, said photo-crosslinkable composition of a UV "cationic" type (A) comprises a mixture of resins chosen between difunctional cyclo-aliphatic epoxy resin, polyol polyester resin, and mixtures thereof, a photo-initiator system, a reactive-diluent system, and various additives.

Suitable difunctional cyclo-aliphatic epoxy resins preferably have an epoxy equivalent weight (EEW) of between 100 and 200, more preferably of between 125 and 150, and a viscosity preferably of between 350 and 450 cP measured at 25° C. For example, a resin of this type is 3,4-epoxycyclohexylmethyl-3',4'epoxycyclohexane carboxylate, such as the commercially available resin CYRACURE® UVR 6110, produced by Dow Chemical Company.

The above difunctional cyclo-aliphatic epoxy resins are advantageously used in an amount of between 60 wt % and 85 wt %, preferably between 65 wt % and 75 wt %.

Polyol polyester resins that can be used are preferably triols, in particular ε-caprolactone triol, preferably having a hydroxyl equivalent weight (OHEW) of between 100 and 250, more preferably between 170 and 190, with a viscosity preferably of between 2000 and 2100 cP measured at 25° C. A resin of this type which is particularly suitable is the product TONE® caprolactone polyol 0305, produced by Dow Chemical Company.

The above polyol polyester resins are advantageously added in an amount of between 2 wt % and 15 wt %, more preferably between 5 wt % and 10 wt %.

The photo-initiator system of said composition generally comprises a cationic photo-initiator, for example of the type that generates photo-latent acid of the salts of the triaryl sulphonium type (TAS salts) or salts of the diaryl iodonium type (DAI salts). The cationic photo-initiator is preferably added to the photo-linking composition, in a percentage of between 1 wt % and 5 wt %, more preferably between 2 wt % and 4 wt %.

It has been verified that the use of a mixture of salts of triaryl sulphonium hexafluorophosphate, for example in a 50% solution of propylene carbonate, of the type CYRACURE® UVI-6992, produced by Dow Chemical Company, is particularly suitable.

Alternatively, it is possible to use a salt of diaryl iodonium, such as, for example, 4-(isobutyl-phenyl)-4-methylphenyl iodonium hexafluorophosphate, in a 75% solution of propylene carbonate, in percentages of between 0.5% and 4%, preferably between 1% and 3%.

The reactive-diluent system of the UV photo-crosslinkable composition (II) is a substance suited for reducing the viscosity of the photo-crosslinking composition, having the capacity of reacting with the system. Advantageously, this diluent possesses a hydroxyl functionality of the type 3-ethyl-3-hydroxy-methyl-oxyethane, such as for example the product CYRACURE® UVR 6000, produced by Dow Chemical Co., or of the type 1 methoxy-2-propanol, such as, for example, DOWANOL® PM, once again produced by Dow, or mixtures thereof.

Advantageously, said reactive-diluent system is added to the crosslinking composition in an amount of between 5 wt % and 20 wt %, and preferably between 10 wt % and 15 wt %.

Preferably, the photo-crosslinking composition of a cationic type (A) further comprises one or more additives that are added for improving slip and spreading.

It has in fact been verified that, during the formation of the coating film, there may arise numerous problems, such as inadequate wetting of the painted area, poor levelling, formation of craters and other drawbacks. The phenomena that develop on the surface of the film play an important role in the formation of defects, and may also affect the properties of the film itself. The above phenomena may be considerably affected by the addition of small amounts of surface-active substances.

Certain substances of a surface-active type, i.e., substances that reduce the surface tension of a liquid, for example, by concentrating on the interface that is in contact with the air, have proved suitable for use.

Suitable surfactants comprise siloxanes modified with polyether or polyester modifications. It has been found that the presence of the above additives contribute to modifying at least one of the following properties:

improvement of levelling and spreading;
control of wave effect;
control over the separation of the pigments;
reduction of the coefficient of friction (improvement of surface slip);
increase in scratch resistance; and
improvement in wetting of the substrate.

A particularly suitable additive is siloxane polyether copolymer, for example, of the type TEGOGLIDE® 440, produced by Tego Degussa Additivi, added to the composition in percentages preferably of between 0.1 wt % and 1.0 wt %, more preferably between 0.2 wt % and 0.5 wt %.

The photo-crosslinkable composition (II) of the "radical-acrylic" type (13) comprises one or more urethane acrylate resins of an aliphatic type, one or more monomeric reactive diluents, a photo-initiator system, and one or more additives.

Suitable urethane acrylate resins comprise one or more of the following types of resin:

a) Urethane-acrylate oligomeric resin of an aliphatic type, preferably having a molecular weight of between 700 and 1500, more preferably between 900 and 1100, and having a viscosity advantageously of between 1800 and 2200 mPa·s at 60° C. It has moreover been found that the functionality of this oligomer may be equal to unity or higher, even though the preferred functionality is 6. A commercial example of the oligomer described may be EBECRYL® 1290, produced by UCB Chemicals; alternatively, Bencryl 655, produced by Benasedo S.p.A., may be used.
In the formulation, this compound may be between 2 wt % and 15 wt %; however, it is preferable to use it in percentages of between 4 wt % and 8 wt %. It is introduced into the formulation to bestow on the coating the properties of hardness, high resistance to solvents, and durability to external agents (exterior durability).

b) Urethane-acrylate oligomeric resin of an aliphatic type, preferably having a molecular weight of between 1000 and 1500, more preferably between 1100 and 1300, advantageously diluted with 12% of acrylic monomer 1,6-hexanediol diacrylate (HDDA), and having a viscosity advantageously of between 1800 and 2200 mPa·s at 60° C. It has moreover been found that the functionality of this oligomer may be equal to unity or higher, even though the preferred functionality is 2. A commercial example of this oligomer may be EBECRYL® 284, produced by UCB Chemicals.
In the formulation, this compound may be between 1% and 10%, and it is preferable to use it in percentages of between 2% and 5%.

It is introduced into the formulation to bestow on the coating the properties of ???leatheriness and excellent durability to external agents (exterior durability).

c) Urethane-acrylate oligomeric resin of an aliphatic type, advantageously with a molecular weight of between 300 and 700, preferably between 400 and 600, and having a viscosity advantageously of between 6500 and 7500 mPa·s at 25° C. It has moreover been found that the functionality of this oligomer may be equal to unity or higher, even though the preferred functionality is 2. A commercial example of the oligomer described may be EBECRYL® 4858, produced by UCB Chemicals.
In the formulation, the percentage of this compound may be between 5% and 25%; however, it is preferable to use it in percentages of between 10% and 18%. It is introduced into the formulation to bestow on the coating the properties of excellent durability to external agents and chemical resistance.

d) Urethane-acrylate oligomeric resin of an aliphatic type, preferably with a molecular weight of between 600 and 1000, more preferably between 700 and 900, having a viscosity advantageously of between 600 and 800 mPa·s at 60° C. It has moreover been found that the functionality of this oligomer may be equal to unity or higher, even though the preferred functionality is 6. A commercial example of the oligomer described may be Bencryl 646, produced by Benasedo S.p.A.; alternatively EBECRYL® 5129, produced by UCB Chemicals, may be used.
In the formulation, the percentage of this compound may be between 10 wt % and 40 wt %, however, it is preferable to use it in percentages of between 15 wt % and 25 wt %.

It is introduced into the formulation to bestow on the coating the properties of resistance to abrasion and flexibility.

Particularly suitable monomeric reactive diluents have acrylic functionality to enable optimization of the features of the coating in question and as viscosity regulators.

In accordance with one embodiment of the invention, a particularly suitable mixture consists of a multifunctional acrylic monomeric reactive diluent, preferably of the difunctional type, with a molecular weight conveniently of between 200 and 400, and preferably between 250 and 350, and having a viscosity advantageously of between 5 and 20 mPa·s at 25° C., of the tripropylene glycol diacrylate (TPGDA) type, conveniently present in an amount of between 25 wt % and 45 wt %, preferably between 30 wt % and 40 wt %, and an acrylic ethoxylate multifunctional monomeric reactive diluent, preferably of the trifunctional type with a molecular weight conveniently of between 350 and 500, and preferably between 400 and 450, and having a viscosity advantageously of between 70 and 90 mPa·s at 25° C., of the trimethylolpropane ethoxylated triacrylate (TMP-EOTA) type, conveniently present in an amount between 10 wt % and 30 wt %, preferably between 15 wt % and 20 wt %.

The photo-initiator system of said photo-crosslinkable composition (11) performs an essential function for obtaining rapid and effective crosslinking of the components of the composition.

Suitable photo-initiators comprise compounds photo-sensitive to UV radiation as sources of free radicals, such as, for example, benzophenones, acetophenones derived as α-hydroxyalkylphenyl ketones, benzoyn alkyl ketals, monoacylphosphine oxides, bisacylphosphine oxides, and mixtures thereof.

It has moreover been found that the presence of more than one photo-initiator in the formulation of the photo-crosslinkable composition, in addition to increasing the rate of polymerization of the acrylic-base polymeric mixture determines balancing of the degree of hardening of the paint both at a superficial level and at a deep level.

According to a preferred embodiment, a mixture of two photo-initiators is used, conveniently made up of a bisacylphosphine oxide and an α-hydroxyalkylphenyl ketone.

For example, a particularly suitable mixture of photo-initiators consists of a mixture of a bisacylphosphine oxide of the type IRGACURE® 819, produced by Ciba Speciality Chemicals, conveniently present in an amount of between 0.5 wt % and 1.5 wt %, preferably between 0.8 wt % and 1.2 wt %, and an α-hydroxyalkylphenyl ketone of the type DAROCUR® 1173, produced by Ciba Speciality Chemicals, conveniently present in an amount of between 3 wt % and 5 wt %, preferably between 3.5 wt % and 4.5 wt %.

Typically, the photo-initiators are present as a mixture in the photo-crosslinkable composition in an amount ranging between 4 wt % and 6 wt %.

In accordance with one embodiment of the invention, the photo-crosslinkable composition (II) of a UV "radical-acrylic" type (B) comprises one or more additives for improving slip and spreading of the coating, of the type previously described in the photo-crosslinkable composition (II) of the a UV "cationic" type (A).

A particularly suitable additive is the siloxane polyether copolymer, for example, of the type TEGOGLIDE® 440, produced by Tego Degussa Additivi, added to the composition in percentages preferably of between 0.1 wt % and 1.0 wt %, more preferably between 0.2 wt % and 0.5 wt %.

The substrates suitable for application of the multi-coating system according to the present invention comprise substrates compatible with the coatings that can undergo crosslinking by means of UV light. Preferred polymeric substrates comprise thermoplastic materials, such as PE, PP, PET, PVC, and PA. In accordance with one embodiment, prior to application, on particularly critical substrates it is preferable to carry out a treatment, such as flaming, or else corona treatment. The thickness of the substrate is preferably between 10 and 2000 microns. The multi-coating system of the invention is particularly suitable for application on three-dimensional pieces, such as bottles made of PET, advantageously to be carried out by dip coating of the pieces to be treated in the multi-coating system, with subsequent centrifuging of the pieces to eliminate the part of coating in excess. This technique of application enables a practically total transfer of product to be obtained on the pieces to be treated, without running into the problems of transfer and overspray of the spray application. In the case of application of the double-coating system on bottles made of PET, an effective amount of crosslinkable solution (I) is applied on the bottle, for example by means of the dip-coating technique, by dipping the bottle and then centrifuging it by causing it to rotate on its axis at a variable rate, so as to obtain a thickness of the dry film of between 1 and 4 microns. Then, the photo-crosslinkable composition (II) is applied on the first crosslinked layer of coating in order to obtain a thickness of the dry film ranging between 4 and 10 microns.

In accordance with another aspect of the present invention, there is provided a process for the application and hardening of the coating system described above on a substrate.

The technique of UV crosslinking used within the context of the invention preferably draws upon the use of a source of emission of radiation between the wavelengths of 200 and 400 nm. Suitable sources of UV radiation comprise medium-pressure mercury-vapour lamps (Hg lamps).

A first step of the process envisages the application on a substrate of a photo-crosslinkable solution (I) described previously, and then subsequent crosslinking by means of irradiation with ultraviolet light, produced by UV lamps.

Advantageously, the crosslinking step is preceded by a flash-period step, in which the sample treated with the paint is exposed to a temperature preferably of between 55° C. and 65° C., for example by means of exposure to IR lamps, or else by exposure to hot air, for a variable length of time, and typically of between 30 and 50 seconds, in order to enable evaporation of the aqueous phase of the formulation.

Advantageously, medium-pressure mercury-vapour lamps (Hg lamps) are used for crosslinking.

Merely by way of example, in the case where it is necessary to carry out crosslinking between 2 and 3 microns dry of photo-crosslinkable solution (I) applied on the substrate, the sample is treated with a mercury lamp so as to measure on the irradiated sample a dose (expressed in mJ/cm$^2$) necessary for crosslinking, conveniently of the following values:

Region of the spectrum: UV-A (between 320 and 390 nm): 480-500 mJ/cm$^2$

Region of the spectrum: UV-B (between 280 and 320 nm): 430-450 mJ/cm$^2$

Region of the spectrum: UV-C (between 250 and 260 nm): 70-90 mJ/cm$^2$

Region of the spectrum: UV-Vis (between 395 and 445 nm): 310-340 mJ/cm$^2$.

Once a first layer of protection has been obtained through crosslinking of the solution (I), the photo-crosslinkable composition (II) is applied. After application of the composition, it is crosslinked by irradiation with ultraviolet light, produced by UV lamps.

Conveniently, the crosslinking step is preceded by a flash-period step, in which the sample treated with the paint is exposed to a temperature typically of between 55° C. and 65° C., for example by means of exposure to IR lamps or else by exposure to hot air for a variable length of time and typically an interval of between 10 and 30 seconds in order to enable spreading of the product. Advantageously, medium-pressure mercury-vapour lamps (Hg lamp) are used for crosslinking.

Merely by way of example, in the case where it is necessary to carry out crosslinking between 6 and 8 microns dry of an embodiment of the composition (II) applied on a substrate, the substrate is treated with a mercury lamp so as to measure on the irradiated substrate a dose (expressed in mJ/cm$^2$) required for crosslinking, of the following values:

Region of the spectrum: UV-A (between 320 and 390 nm): 260-280 mJ/cm$^2$

Region of the spectrum: UV-B (between 280 and 320 nm): 180-200 mJ/cm$^2$

Region of the spectrum: UV-C (between 250 and 260 nm): 30-50 mJ/cm$^2$

Region of the spectrum: UV-Vis (between 395 and 445 nm): 170-190 mJ/cm$^2$.

The process according to the present invention enables a coating to be made that constitutes a barrier which prevents entry of oxygen and exit of carbon dioxide, the said coating being specifically recommended for use in the sector of materials for packaging and bottling of foodstuffs and beverages.

Furthermore, the process of the invention enables a double-coating system of protection to be obtained, with high rates of crosslinking and low consumption of energy: Furthermore, since the coating process envisages a low VOC, thanks to the reduced use of solvents, it presents a favourable environmental impact.

The following examples are provided merely by way of illustration of the present invention and must hence not be understood in a sense that might in any way limit the sphere of protection, such as this is defined in the attached claims.

EXAMPLE 1

Preparation of an Embodiment of the Photo-Crosslinkable Solution (I) According to the Invention:

1) Preparation of a 15% solution of PVOH—degree (degree of saponification): 98 in H$_2$O:
- demineralized water with a zero bacterial content was poured into a clean reactor; the reactor was then heated, under stirring, up to 90-95° C.;
- the PVOH was added slowly, in order not to create agglomerates, maintaining the temperature at 95-98° C., until a clear solution with a viscosity in line with specifications was obtained; the product was then cooled to 40° C. and filtered with a 1-micron bag filter.

2) Preparation of 1 kg of a 5% PVOH solution of photopolymer having 16% SBQ (referred to the PVOH):
- The following were loaded into a clean reactor: approximately 333 g of the solution of PVOH prepared in point 1, approximately 8 g of 80% phosphoric acid, approximately 8 g of SBQ, and demineralized water as required;
- The above was heated to 40° C., maintaining this temperature for 24 h, verifying, by measuring absorbance, the progress of the condensation reaction. During this step of preparation, the aldehyde part of the SBQ reacts with the hydroxyl groups OH present in the structure of the polyvinyl alcohol PVOH (acetalization step), with the formation of a cyclic acetal.
- At the end of the reaction, the following were measured: viscosity and pH.
- The product was filtered and then poured off;
- All the above operations were carried out in conditions of total darkness, in order not to cause degradation of the SBQ.

To the solution prepared above was added n-methylpyrrolidone or else isopropyl alcohol in a percentage of approximately 1 wt %, in order to improve the features of wettability of the substrate.

EXAMPLE 2

A paint product which can be crosslinked by UV radiation, suitable for bestowing oxygen-barrier properties on a substrate made of PET.

This is formulated following the indications appearing in the description of Example 1.

Formulation of the Photo-Crosslinkable Solution:

| | |
|---|---|
| PVOH: Mowiol ® 10-98 at 15% in H$_2$O: | 33.3% |
| SBQ: | 0.8% |
| 80% Phosphoric acid: | 0.8% |
| De-ionized water: | 64.1% |
| Wetting additive (isopropyl alcohol): | 1.0% |
| Solid content: | 5-6% |
| Viscosity (cP) at 25° C.: | 130 |
| Colour: | <1 (shade: cedar) |

EXAMPLE 3

Formulation of a Photo-Crosslinkable Composition (II) by UV Radiation of a Cationic Type (A)

| | |
|---|---|
| Cyclo-aliphatic epoxy resin - CYRACURE ® UVR 6110: | 75.0% |
| Polyol polyester resin - TONE ® Caprolactone polyol 0305: | 10.0% |
| Sulphonium-salt photo-initiator - CYRACURE ® UVI-6992: | 4.0% |
| Reactive diluent (1 methoxy-2-propanol): | 0.9% |
| Additive (siloxane polyether copolymer - TEGO ® GLIDE 440): | 0.1% |

EXAMPLE 4

Formulation of a Photo-Crosslinkable Composition (II) by UV Radiation of Radical-Acrylic Type (B)

| | |
|---|---|
| Hexafunctional urethane acrylate aliphatic resin - PM 1000: | 4.0% |
| Difunctional urethane acrylate aliphatic resin (12% solution in HDDA) - PM 1000: | 5.0% |
| Difunctional urethane acrylate aliphatic resin - PM 500: | 15.0% |
| Hexafunctional urethane acrylate aliphatic resin - PM 800: | 20.0% |
| Acrylic monomer reactive diluent - TPGDA: | 35.0% |
| Acrylic monomer reactive diluent - TMP(EO)TA: | 17.3% |
| Photo-initiator (bisacylphosphine oxide): | 0.5% |
| Photo-initiator (α-hydroxyalkylphenyl ketone): | 3.0% |
| Additives (siloxane polyether copolymer, e.g., TEGO ® GLIDE 440): | 0.2% |

Measurement of Barrier Properties

There exist various methods for measuring the ratio of permeation or diffusion of a gas or liquid through a polymer.

The method used for measuring permeability to gases in the present work envisages the use of an instrument devised and developed by Modem Controls Inc. (MOCON), which determines the ratio of permeation of oxygen through polymeric samples in time intervals that are decidedly shorter than those of other methods of evaluation (e.g., Dow Permeation Cell). The instrument (e.g., OX-TRAN 220) is a diffusion cell that uses a specific detector for oxygen. Also provided are chambers for the introduction of water vapour into the gas, the said chambers being provided with flow controllers. The film may also be tested in contact with water.

With the sample set in position, the top and bottom chambers of the diffusion cell start cleaning with an oxygen-free gas (99% nitrogen, 1% hydrogen) to remove all the residual oxygen from the system and all the oxygen de-adsorbed from the sample.

Next, pure oxygen is introduced into the top diffusion chamber, and the test is performed by measuring the concentration of oxygen that permeates through the film using a subcurrent detector.

The constant value of permeability, obtained after appropriate conditioning of the sample on the instrumentation, with subtraction of the background value of the instrument, constitutes the result of the test.

The conditioning time must be such as to enable elimination of the oxygen present inside the specimen and proper solubilization thereof in the wall of the test film.

The Oxygen Transmission Rate was assessed (expressed as $cc/(m^2 \cdot day)$ under the pressure conditions of 1 atm., and with 0% relative humidity of the permeating species under controlled-temperature conditions).

The decrease in Oxygen Transmission Rate on the painted sample will be expressed also as a multiplicative factor with respect to the reference standard (2×, 5×, 10×, etc.)

Samples Assessed and Results

For each type of mixture obtained within the framework of the foregoing description, applications on plane plastic film were conducted in the laboratory. The choice of applying the samples of paint on plane plastic film was made on the basis of the fact that this is the fastest and most practical system for assessing the overall features.

As reference film, a film of polyester having a thickness of approximately 36 microns was used.

The following specimens were adopted:

Film+gas-barrier paint of EXAMPLE 2 (1 micron dry)+ paint of EXAMPLE 3 (6 microns dry); and Film+gas-barrier paint of EXAMPLE 2 (1 micron dry)+ paint of EXAMPLE 4 (6 microns dry).

|  | Reference film NOT PAINTED | Film + EXAMPLE 2 + EXAMPLE 3 | Film + EXAMPLE 2 + EXAMPLE 4 |
|---|---|---|---|
| Oxygen Transmission Rate $cc/(m^2 \cdot day)$ | 37.7659 | 0.6227 | 0.7233 |
| Barrier multiplicative factor | 1 | 60.6 | 52.2 |
| Flexibility | — | good | quite good |
| Resistance to heat treatment | — | good | poor |
| Resistance to treatment with acids | — | poor | good |

The invention claimed is:

1. A multi-coating system with gas-barrier properties that is able to undergo crosslinking by means of UV radiation, comprising:
   a first layer of coating comprising a solution that can undergo photo-crosslinking (I) by means of exposure to UV radiation, wherein said photo-crosslinkable solution (I) comprises polyvinyl alcohol (PVOH) and a substance photo-sensitive to UV radiation comprising in its molecule at least one aldehyde functional group and at least one carbon-carbon double bond (C=C); and
   a second layer of coating comprising a composition that can undergo photo-crosslinking (II) by means of exposure to UV radiation, wherein said photo-crosslinkable composition (II) comprises mixtures of
      at least one cationic resin which can be crosslinked by means of UV radiation selected from the group consisting of epoxy resins, polyol polyester resins, and a mixture thereof, and reactive diluent, and cationic photo-initiator; or
      at least one radically-crosslinkable acrylate resin, reactive diluent, and free radical photo-initiator; and
   wherein the multi-coating system prevents entry of oxygen and exit of carbon dioxide after the layers of coating the multi-coating system are crosslinked by means of UV radiation.

2. The multi-coating system according to claim 1, wherein said substance photo-sensitive to UV radiation is 4-[2-(4-formylphenyl)-ethenyl]-1-methylpyridinium methylsulphate.

3. The multi-coating system according to claim 1, wherein said photo-crosslinkable solution (I) further comprises an acidifying substance, and a finishing agent for increasing the features of wettability.

4. The multi-coating system according to claim 3, wherein said acidifying substance is phosphoric acid.

5. The multi-coating system according to claim 3, wherein said finishing agent is n-methyl pyrrolidone, isopropyl alcohol, or mixtures thereof.

6. The multi-coating system according to claim 1, wherein said photo-crosslinkable solution (I) further comprises a solution of titanium acetyl acetonate.

7. The multi-coating system according to claim 6, wherein said solution of titanium acetyl acetonate comprises titanium chelate with acetyl acetone as chelating agent.

8. The multi-coating system according to claim 1, wherein said photo-crosslinkable solution (I) further comprises a diazo compound.

9. The multi-coating system according to claim 8, wherein said diazo compound is benzenediazonium-4-(phenylamino)hydrogen phosphate polymer in a 1:1 solution with formaldehyde.

10. The multi-coating system according to claim 1, wherein said photo-crosslinkable composition (II) comprises a mixture that can undergo photo-crosslinking, consisting of at least one cationic resin which can be crosslinked by means of UV radiation, at least one reactive diluent and a photo-initiator.

11. The multi-coating system according to claim 10, wherein said cationic resin, which can be crosslinked by means of UV radiation, is chosen from the group consisting of difunctional cyclo-aliphatic epoxy resin, polyol polyester resin, and mixtures thereof.

12. The multi-coating system according to claim 11, wherein said difunctional cyclo-aliphatic epoxy resin has an epoxy equivalent weight of between 100 and 200.

13. The multi-coating system according to claim 11, wherein said difunctional cyclo-aliphatic epoxy resin is 3,4-epoxy-cyclohexyl-methyl-3',4'epoxycyclohexane carboxylate.

14. The multi-coating system according to claim 11, wherein said polyol polyester is a ϵcaprolactone triol.

15. The multi-coating system according to claim 10, wherein said photo-initiator is a salt of triaryl sulphonium (TAS salts) or a salt of diaryl iodonium (DAI salts), or mixtures thereof.

16. The multi-coating system according to claim 10, wherein said reactive diluent contains a hydroxyl functionality.

17. The system according to claim 16, wherein said reactive diluent is 3-ethyl-3-hydroxy-methyl-oxyethane, 1 methoxy-2-propanol, or mixtures thereof.

18. The multi-coating system according to claim 10, wherein it further comprises an additive for improving slip selected from the group consisting of silicone oligomers, siloxanes modified with polyether, and siloxanes modified with polyester.

19. The multi-coating system according to claim 1, wherein said photo-crosslinkable composition (II) comprises a mixture that can undergo photo-crosslinking, consisting of at least one radically crosslinkable acrylic resin, a monomeric reactive diluent, and a photo-initiator.

20. The multi-coating system according to claim 19, wherein said acrylic resin is urethane-acrylate oligomeric resin of an aliphatic type.

21. The system according to claim 20, wherein said aliphatic urethane-acrylate oligomeric resin is selected from the group consisting of:
    a) an aliphatic urethane-acrylate oligomeric resin with a molecular weight of between 700 and 1500;
    b) an aliphatic urethane-acrylate oligomeric resin with a molecular weight of between 100 and 1500;
    c) an aliphatic urethane-acrylate oligomeric resin with a molecular weight of between 300 and 700;
    d) an aliphatic urethane-acrylate oligomeric resin with a molecular weight of between 600 and 1000; and mixtures thereof.

22. The system according to claim 21, wherein said resin a) and d) are hexafunctional and said resins b) and c) are difunctional.

23. The multi-coating system according to claim 19, wherein said photo-initiating agent is selected from the group consisting of benzophenones, acetophenones, benzoin alkyl ketals, mono-acylphosphine oxides, bisacylphosphine oxides, and mixtures thereof.

24. The multi-coating system according to claim 23, wherein said photo-initiating agent is a mixture of bisacylphosphine oxide and α-hydroxyalkylphenyl ketone.

25. The multi-coating system according to claim 24, wherein said reactive diluent is a mixture of an acrylic multifunctional monomeric reactive diluent and an acrylic-ethoxylate multifunctional monomeric reactive diluent.

26. The multi-coating system according to claim 19, wherein said monomeric reactive diluent is provided with acrylic functionality.

27. The multi-coating system according to claim 1, wherein said photo-crosslinkable solution (I) is a hydro-alcoholic solution, in which said polyvinyl alcohol is present in an amount of between 2% and 15%.

28. A substrate made of thermoplastic material coated with a layer having gas-baffler properties, obtained by UV crosslinking of the system according to claim 1.

29. The substrate according to claim 28, wherein it is made of a thermoplastic material chosen from among poly (ethylene), poly(propylene), poly(ethylene terephthalate), poly(vinyl chloride), and poly( amide).

30. The substrate according to claim 28, wherein it is a bottle made of poly(ethylene terephthalate).

* * * * *